United States Patent
Lee et al.

(10) Patent No.: US 12,364,104 B2
(45) Date of Patent: Jul. 15, 2025

(54) DISPLAY DEVICE HAVING A CONDUCTIVE METAL LAYER DISPOSED ON A SURFACE OF AN ANTIREFLECTION LAYER

(71) Applicant: Samsung Display Co., Ltd., Yongin-Si (KR)

(72) Inventors: Ju Hyun Lee, Seongnam-si (KR); Gyung Min Baek, Yongin-si (KR); Hyun Eok Shin, Gwacheon-si (KR); Sung Joo Kwon, Goyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/741,771

(22) Filed: Jun. 13, 2024

(65) Prior Publication Data
US 2024/0334739 A1     Oct. 3, 2024

Related U.S. Application Data

(62) Division of application No. 17/400,158, filed on Aug. 12, 2021, now Pat. No. 12,041,818.

(30) Foreign Application Priority Data

Oct. 19, 2020   (KR) .................. 10-2020-0135053

(51) Int. Cl.
*H10K 59/80*     (2023.01)
*H10K 50/86*     (2023.01)
(Continued)

(52) U.S. Cl.
CPC ......... *H10K 59/121* (2023.02); *H10K 50/865* (2023.02); *H10K 59/122* (2023.02);
(Continued)

(58) Field of Classification Search
CPC .... H10K 59/122; H10K 59/124; H10K 59/50; H10K 59/65; H10K 59/8791; H10K 59/8792; H10K 50/86; H10K 50/865
(Continued)

(56) References Cited

U.S. PATENT DOCUMENTS 9,118,035 B2    8/2015   Park et al.
9,206,960 B2    12/2015  Kang
(Continued)

FOREIGN PATENT DOCUMENTS

CN     208271493 U      12/2018
KR     10-2013-0054014 A    5/2013
(Continued)

*Primary Examiner* — Hoai V Pham
(74) *Attorney, Agent, or Firm* — Innovation Counsel LLP

(57) ABSTRACT

A display devise is provided. A display device includes a substrate, a lower metal pattern disposed on one surface of the substrate, a buffer layer disposed on the one surface of the substrate to cover the lower metal pattern, a semiconductor layer disposed on the buffer layer, a gate insulating film disposed on the semiconductor layer, and a gate electrode disposed on the gate insulating film, wherein the lower metal pattern includes an antireflection layer disposed on the one surface of the substrate and a conductive metal layer disposed on one surface of the antireflection layer, and the antireflection layer includes molybdenum oxide (MoOx) and at least one of zinc oxide (ZnOx) and indium oxide (InOx).

6 Claims, 12 Drawing Sheets

(51) Int. Cl.
*H10K 59/121* (2023.01)
*H10K 59/122* (2023.01)
*H10K 59/65* (2023.01)

(52) U.S. Cl.
CPC ..... *H10K 59/8791* (2023.02); *H10K 59/8792* (2023.02); *H10K 59/65* (2023.02)

(58) Field of Classification Search
USPC .................................................. 257/86, 865
See application file for complete search history.

(56) References Cited

U.S. PATENT DOCUMENTS

| | | |
|---|---|---|
| 10,222,527 B2 | 3/2019 | Han et al. |
| 10,847,076 B2 | 11/2020 | Shin et al. |
| 11,217,639 B2 | 1/2022 | Baek et al. |
| 2014/0042396 A1 | 2/2014 | Yang et al. |
| 2019/0172873 A1* | 6/2019 | Ji ........................... H10K 50/11 |
| 2020/0026134 A1 | 1/2020 | Lee et al. |
| 2021/0336232 A1 | 10/2021 | Baek et al. |

FOREIGN PATENT DOCUMENTS

| | | |
|---|---|---|
| KR | 10-2014-0013616 A | 2/2014 |
| KR | 10-2016-0052937 A | 5/2016 |
| KR | 10-2020-0036137 A | 4/2020 |
| KR | 10-2182828 B1 | 11/2020 |
| KR | 10-2021-0132777 A | 11/2021 |

\* cited by examiner

DPA: DPA_D, DPA_T

DISPLAY DEVICE HAVING A CONDUCTIVE METAL LAYER DISPOSED ON A SURFACE OF AN ANTIREFLECTION LAYER

This application is a divisional application of U.S. patent application Ser. No. 17/400,158 filed on Aug. 12, 2021, which claims priority to Korean Patent Application No. 10-2020-0135053 filed on Oct. 19, 2020, in the Korean Intellectual Property Office, and all the benefits accruing therefrom under 35 U.S.C. 119, the contents of which in their entireties are herein incorporated by reference.

BACKGROUND

1. Field

The present inventive concept relates to a display device.

2. Description of the Related Art

A display device for displaying an image is used for various electronic appliances for providing an image to a user, such as smart phones, tablet PCs, digital cameras, notebook computers, navigators, and televisions.

The display device may include various optical devices, such as an image sensor for capturing an image of in front of the display device, a proximity sensor for detecting whether a user is located close to the front surface of the display device, an illumination sensor for detecting the illumination of light to the front surface of the display device, an iris sensor for recognizing a user's iris, and the like.

As the display device is applied to various electronic appliances, the demand for a display device having various designs is increasing. For example, in the case of smartphones, a display device capable of expanding a display area by removing holes disposed on the front surface of the display device has been required. In this case, optical devices which have been in the holes disposed on the front surface of the display device may be disposed to overlap a display panel.

SUMMARY

Aspects of the present inventive concept are to provide a display device capable of suppressing or preventing defects that may be caused by the reflection of external light incident on the display device.

The objects of the present inventive concept are not limited to the above-mentioned objects, and other technical objects not mentioned can be clearly understood by those skilled in the art from the following description.

An embodiment of a display device includes a substrate, a lower metal pattern disposed on one surface of the substrate, a buffer layer disposed on the one surface of the substrate to cover the lower metal pattern, a semiconductor layer disposed on the buffer layer, a gate insulating film disposed on the semiconductor layer, and a gate electrode disposed on the gate insulating film, wherein the lower metal pattern includes an antireflection layer disposed on the one surface of the substrate and a conductive metal layer disposed on one surface of the antireflection layer, and the antireflection layer includes molybdenum oxide ($M_oO_x$) and at least one of zinc oxide ($Z_nO_x$) and indium oxide ($I_nO_x$)).

An embodiment of a display device includes a substrate, A buffer layer disposed on one surface of the substrate, a semiconductor layer disposed on the buffer layer, a gate insulating film disposed on the semiconductor layer, a gate electrode disposed on the gate insulating film, and a lower metal pattern disposed on the other surface of the substrate, wherein the lower metal pattern includes a conductive metal layer disposed on the other surface of the substrate and an antireflection layer disposed on the other surface of the conductive metal layer, and the antireflection layer includes molybdenum oxide ($M_oO_x$) and at least one of zinc oxide ($Z_nO_x$) and indium oxide ($I_nO_x$).

According to a display device according to one embodiment, it is possible to suppress or prevent defects that may be caused by the reflection of external light incident with the display device.

The effects of the embodiments are not limited by the contents illustrated above, and more various effects are included herein.

BRIEF DESCRIPTION OF THE DRAWINGS

The above and other aspects and features of the present inventive concept will become more apparent by describing in detail embodiments thereof with reference to the attached drawings, in which.

DETAILED DESCRIPTION OF THE EMBODIMENTS

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art.

It will also be understood that when a layer is referred to as being "on" another layer or substrate, it can be directly on the other layer or substrate, or intervening layers may also be present. The same reference numbers indicate the same components throughout the specification.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

Hereinafter, embodiments will be described with reference to the attached drawings.

Figure 1:
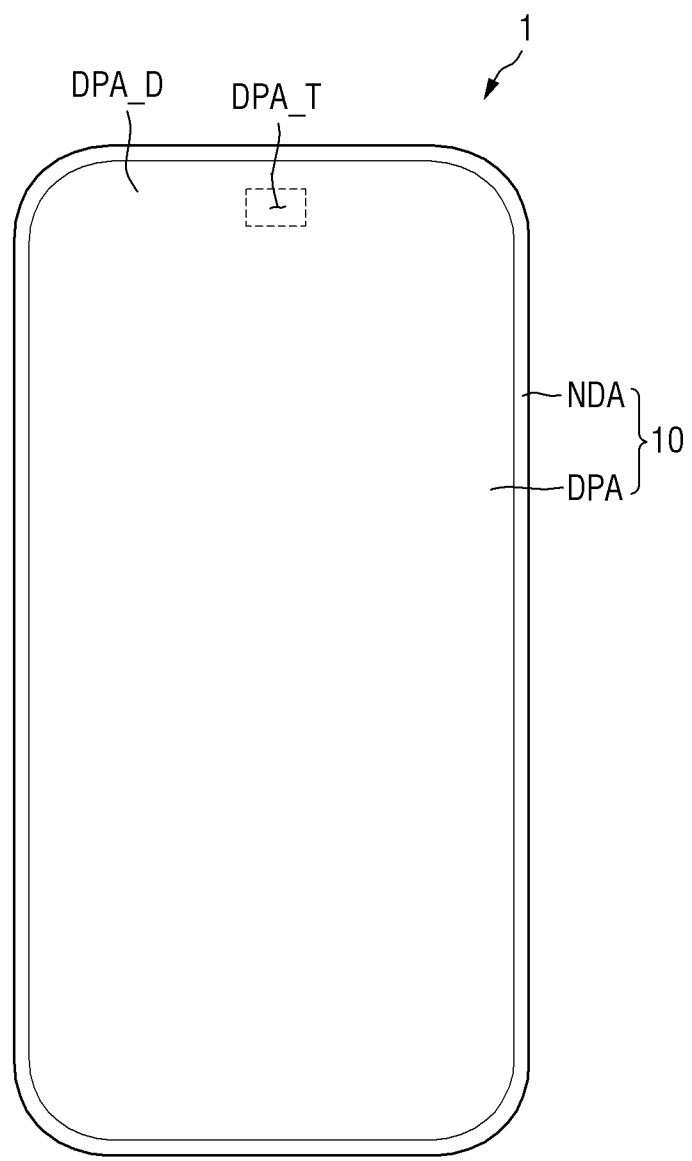
FIG. 1 is a plan view of a display device according to an embodiment.
Figure 2:
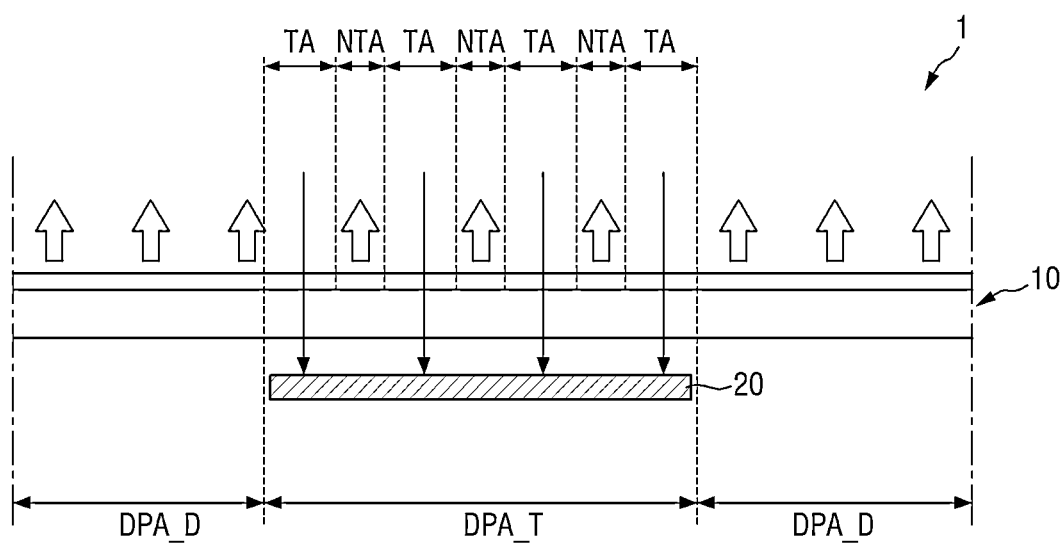
FIG. 2 is a partial cross-sectional view of the display device according to the embodiment.

FIG. 1 is a plan view of a display device according to an embodiment. FIG. 2 is a partial cross-sectional view of the display device according to the embodiment.

Referring to FIGS. 1 and 2, a display device 1 is an electronic device including a display area DPA that displays an image or a video. The display device 1 may be construed to correspond to the display device regardless of a main use, an addition function, a name, or the like, as long as the display device is a device including the display area DPA that displays an image or a video. Examples of the display device 1 are not limited thereto, but may include smartphones, mobile phones, Tablet PCs, personal digital assistants (PDAs), portable multimedia players (PMPs), televisions, game machines, wrist watch-type electronic devices, head-mount displays, personal computer monitors, laptop computers, car navigations, automobile instrument panels, digital cameras, camcorders, external billboards, electric signboards, various medical devices, various inspection devices, various household appliances including a display area, such as a refrigerator or a washing machine, things of internet, etc.

The display device 1 may include a display panel 10. Examples of the display panel 10 may include not only self-emission display panels, such as an organic light emitting display panel (OLED), an inorganic light emitting display panel (inorganic EL), a quantum-dot light emitting display panel (QED), a micro LED display panel (micro-LED), a nano LED display panel (nano-LED), a plasma display panel (PDP), a field emission display panel (FED), and a cathode-ray display panel (CRT), but also light receiving display panels, such as a liquid crystal display panel (LCD) and an electrophoretic display panel (EPD).

Hereinafter, an organic light emitting display panel will be described as the display panel 10, and the organic light emitting display panel applied to an embodiment is simply abbreviated as the display panel 10 unless otherwise specially distinguished. However, the embodiment is not limited to the organic light emitting display panel 10, but may be applied to other display panels listed above or display panels well known in the art.

The display device 1 may further include various controllers, housings, sensors, and other components in addition to the display panel 10.

The display device 1 may include a display area DPA and a non-display area NDA, as illustrated in FIG. 1. The display area DPA is an area in which an image is displayed, and the non-display area NDA is an area in which the image is not displayed.

Figure 3:
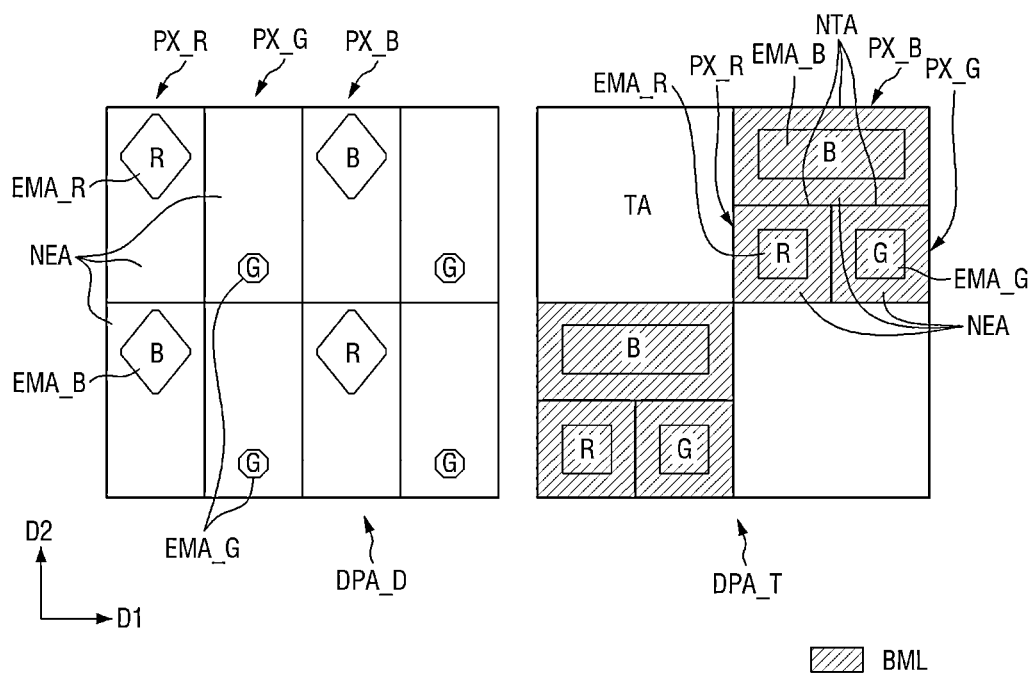
FIG. 3 is a schematic view illustrating an arrangement of pixels, a transmission area, and a non-transmission area for each area of a display panel according to an embodiment.

The display area DPA includes a plurality of pixels PX (refer to FIG. 3). A pixel PX (refer to FIG. 3) is a basic unit that displays the image. The plurality of pixels PX may include red pixels PX_R (refer to FIG. 3), green pixels PX_G (refer to FIG. 3), and blue pixels PX_B (refer to FIG. 3). The plurality of pixels PX (refer to FIG. 3) may be alternately arranged on a plane. For example, the pixels PX (refer to FIG. 3) may be arranged in a matrix configuration but the arrangement of the pixels PX are not limited thereto. The detailed description of the pixels PX (refer to FIG. 3) will be described below.

The non-display area NDA may be disposed outside of the display area DPA. The non-display area NDA may be disposed around the display area DPA to surround the display area DPA. In an embodiment, the display area DPA may have substantially a rectangular shape and the non-display area NDA may be disposed to surround four sides of the display area DPA, but the configuration of the display area DPA and the non-display area NDA is not limited thereto. The non-display area NDA is disposed with a black matrix to block light emitted from the pixels PX (refer to FIG. 3).

The display area DPA may include a first display area and a second display area having different transmission rates. The first display area and the second display area may be distinguished by an existence of a transmission area TA. For example, the display area DPA may include a display dedicated area DPA_D as the first display area and a display transmission area DPA_T as the second display area. The display dedicated area DPA_D does not include the transmission area TA and the display transmission area DPA_T may include the transmission area TA. The display area DPA may include one display light transmission area DPA_T, but the configuration of the display area DPA is not limited thereto, and the display area DPA may include a plurality of display transmission areas DPA_T separated from each other.

The display dedicated area DPA_D may be disposed to surround the display transmission area DPA_T. The display dedicated area DPA_D may partially or entirely surround the display transmission area DPA_T. The display dedicated area DPA_D and the display transmission area DPA_T are adjacent to each other and may be disposed continuously without any intervening area. In an embodiment, the display dedicated area DPA_D and the display transmission area DPA_T may not be visually divided but the configuration of the display area DPA are not limited thereto.

The placement of the display transmission area DPA_T in the display area DPA is not limited to the example described above. For example, the display transmission area DPA_T may be disposed spaced apart from the non-display area NDA to be completely surrounded by the display area DPA. As another example, the display transmission area DPA_T may be disposed close to an edge of the display area DPA or disposed to be in contact with the non-display area NDA.

The display dedicated area DPA_D and the display transmission area DPA_T include a plurality of pixels PX (refer to FIG. 3) including emission areas EMA (refer to FIG. 3) that emit light, thus displaying an image by emission of the emission area EMA (refer to FIG. 3) of each pixel PX (refer to FIG. 3).

The display transmission area DPA_T may include a transmission area TA and a non-transmission area NTA having a transmission rate lower than that of the transmission area TA. The transmission rate of the transmission area TA may be greater than the transmission rate of the non-transmission area NTA. Here, the transmission rate may mean a percentage of light that goes through the transmission area TA and the non-transmission area NTA to reach a lower optical sensor 20 disposed below the display panel 10.

The transmission area TA is an area which transmits light therethrough. The light may include not only a visible light but also a near-infrared and/or infrared light. The light transmitted by the transmission area TA may further include a near-ultraviolet light and/or ultraviolet light. The transmission area TA may be disposed uniformly in the display transmission area DPA_T and formed integrally in the display transmission area DPA_T, but the disposition of the transmission area TA is not limited thereto and a plurality of transmission areas TA which are separated from each other may be disposed in the display area DPA.

A non-emission area NEA (refer to FIG. 3) in the display dedicated area DPA_D or the display transmission area DPA_T is an area in which light is not emitted. The transmission area TA may be an area that has a higher transmission rate than that of the non-emission area NEA (refer to FIG. 3). Here, the transmission rate means a percentage of light that goes through each area. Accordingly, the display transmission area DPA_T including the transmission area TA has a higher transmission rate than that of the display dedicated area DPA_D.

The non-transmission area NTA is an area which does not transmit most of light. That is, the non-transmission area NTA may transmit a smaller amount of external light than that of the transmission area TA. The non-transmission area NTA may include pixels PX (refer to FIG. 3) including emission areas EMA (refer to FIG. 3). The non-transmission area NTA may further include a non-emission area NEA (refer to FIG. 3). In the display transmission area DPA_T, the non-transmission area NTA may be disposed over the remaining area except for the transmission area TA. However, it is not limited thereto, for example, the non-transmission area NTA may also be disposed in the display dedicated area DPA_D as well as the display transmission area DPA_T.

The display transmission area DPA_T may be used for various purposes. One example is to use the display transmission area DPA_T as a transparent display. In this case, other components are not arranged on a rear surface of the display transmission area DPA_T and objects located on the rear surface of the display panel 10 may be seen through the display transmission area DPA_T.

Another example using the light transmission of the display transmission area DPA_T is to utilize the transmission area DPA_T as a passage for light sensing. Specifically, as illustrated in FIG. 2, the display device 1 may include an optical sensor 20 disposed under the display transmission area DPA_T of the display panel 10 to receive light pass through the transmission area TA. The optical sensor 20 is a device for receiving light to obtain information or performing a specific function, and may include a camera, an infrared proximity sensor, an iris recognition sensor, a fingerprint sensor, and the like, including a photoelectric conversion element.

The quantity of light required varies depending on the type of the optical sensor 20 and the optical sensor 20 may receive the required quantity of light by controlling an aperture ratio of the corresponding display transmission area DPA_T (a ratio of the transmission area TA in the entire area) and the transmission rate of the transmission area TA. For example, an area ratio of the transmission area TA in the display transmission area DPA_T or a laminated structure or material in the transmission area TA is adjusted to control the transmission rate of light passing through the transmission area TA, thereby a transmission rate per unit area of the entire display transmission area DPA_T and a total transmission quantity (average transmission rate×area) of light may be appropriately designed.

In some embodiments, the display device 1 may include a plurality of different optical sensors 20. In this case, the transmission rate of the display transmission area DPA_T corresponding to each optical sensor 20 may be adjusted differently depending on the maximum quantity of light required by the corresponding optical sensor 20. The sizes or arrangement of the pixels PX (refer to FIG. 3) and the transmission area TA of each display transmission area DPA_T may be adjusted differently to adjust the transmission rate for each display transmission area DPA_T. In another embodiment, the transmission rate of the display transmission area DPA_T corresponding to each optical sensor 20 may be equally adjusted according to a maximum transmission rate of the optical sensor which requires the maximum quantity of light.

In an emission mode in which the display device 1 displays the image, since the pixels PX (refer to FIG. 3) around the transmission area TA emit the light, the corresponding area is recognized as the display area DPA and the transmission area TA may not be recognized. On the contrary, in a non-emission mode in which the display device 1 does not display the image, since the pixels PX (refer to FIG. 3) around the transmission area TA do not emit the light, the optical sensor 20 may reflect external light thereby a user may recognize the optical sensor 20 that causes a poor appearance, to prevent this problem, the optical sensor 20 may be subjected to surface treatment, such as a matte treatment, a black coating, an antireflective coating, and the like.

Since the display transmission area DPA_T includes the transmission area TA, the density of the pixels PX in the display transmission area DPA_T which associated with the resolution may be different from that in the display dedicated area DPA_D. For example, the resolution of the display transmission area DPA_T may be lower than the resolution of the display dedicated area DPA_D, but it is not limited thereto.

FIG. 3 is a schematic view illustrating an arrangement of a pixel, a transmission area, and a non-transmission area for each area of the display panel according to an embodiment. FIG. 3 illustrates a transmission area TA and a non-transmission area NTA, and an emission area EMA and a non-emission area NEA of each pixel PX.

Referring to FIG. 3, in the embodiment, the display dedicated area DPA_D and the display transmission area DPA_T include red pixels PX_R, green pixels PX_G, and blue pixels PX_B, respectively. In the illustrated embodiment, the size of the pixel PX for each color varies, and the sizes of the pixel PX of the display dedicated area DPA_D and the pixel PX of the display transmission area DPA_T may also be different from each other. For example, planer sizes and shapes of emission areas of the red pixel PX_R and the blue pixel PX_B of the display dedicated area DPA_D may be substantially the same as each other and may be different from the planar size and shape of the green pixel PX_G of the display dedicated area DPA_D, but the present inventive concept is not limited thereto. In addition, planer sizes and shapes of the red pixel PX_R and the green pixel PX_G of the display transmission area DPA_T are substantially the same as each other and may be different from the planar size and shape of the blue pixel PX_B of the display transmission area DPA_T, but the present inventive concept is not limited thereto.

In the drawing, a horizontal direction is referred to as a first direction D1 and a vertical direction is referred to as a second direction D2. The first direction D1 and the second direction D2 are exemplified in a perpendicular direction.

In the display dedicated area DPA_D, pixels PX of different colors are alternately arranged in the first direction D1 and pixels PX of different colors are alternately arranged or pixels PX of the same color are arranged in the second direction D2. For example, in the display dedicated area DPA_D, a red pixel PX_R, a green pixel PX_G, a blue pixel PX_B, and a green pixel PX_G are sequentially arranged in the first direction D1. Further, red pixels PX_R and blue pixels PX_B may be alternatingly arranged in the second direction D2 in odd numbered pixel columns and green pixels PX_G may be arranged in the second directions D2 in even numbered pixel columns. However, the red pixels PX_R and the blue pixels PX_B may be alternatingly arranged in the second direction D2 in even numbered pixel columns and green pixels PX_G may be arranged in the second directions D2 in odd numbered pixel columns. In the display transmission area DPA_T, the transmission areas TA and the non-transmission areas NTA are alternately arranged in the first direction D1 and the second direction D2. In each non-transmission area NTA, pixels PX may be disposed. The red pixel PX_R and the green pixel PX_G are disposed to be adjacent to each other in the first direction D1, and the blue pixel PX_B may be disposed at one side of the second direction D2 of the red pixel PX_R and the green pixel PX_G.

In the display transmission area DPA_T, the number of non-transmission areas NTA and the number of transmission areas TA may be the same as each other. When one pixel PX is disposed in each non-transmission area NTA in the display transmission area DPA_T, the number of pixels PX and the number of transmission areas TA may be the same as each other. In the display transmission area DPA_T, the area of the non-transmission areas NTA and the area of the transmission areas TA may be the same as each other. That is, the area of the transmission areas TA to the entire area of the display transmission area DPA_T may be 50%, but the area of the transmission areas TA to the entire area of the display transmission area DPA_T is not limited thereto, but the area of the transmission areas TA may be greater than the area of the non-transmission areas NTA.

In the display transmission area DPA_T, when the pixels PX and the transmission areas TA are alternately arranged (that is, when the transmission areas TA are alternately arranged between the pixels PX), the presence of the transmission areas TA may not be recognized well as compared to the case when one large transmission area TA is formed in the display transmission area DPA_T. Accordingly, despite the presence of the transmission areas TA, an image may be displayed by the alternately arranged pixels PX so that a user of the display panel does not distinguish whether the corresponding area is the display dedicated area DPA_D or the display transmission area DPA_T. Simultaneously, as described above, the display transmission area DPA_T may be used as a transparent display or an optical sensing path by transmitting the light by the transmission area TA.

The display dedicated area DPA_D and the display transmission area DPA_T may have different resolutions. In other words, the display transmission area DPA_T may have a resolution less than that of the display dedicated area DPA_D because the display transmission area DPA_T has a plurality of transmission areas TA which do not display the image so that the number of pixels PX which may be disposed per unit area in the display transmission area DPA_T may decrease. However, even if the high-resolution area and the low-resolution area are scattered in the display panel 10, the recognition possibility of the user may be lowered by adjusting the arrangement of the areas and the display contents for each area.

The non-transmission area NTA may further include a lower metal pattern BML. The lower metal pattern BML may be disposed over the entire area of the non-transmission area NTA. The planar shape of the lower metal pattern BML may be substantially the same as the planar shape of the non-transmission area NTA. The lower metal pattern BML may overlap with the non-transmission area NTA but may not overlap with the transmission area TA.

Figure 5:
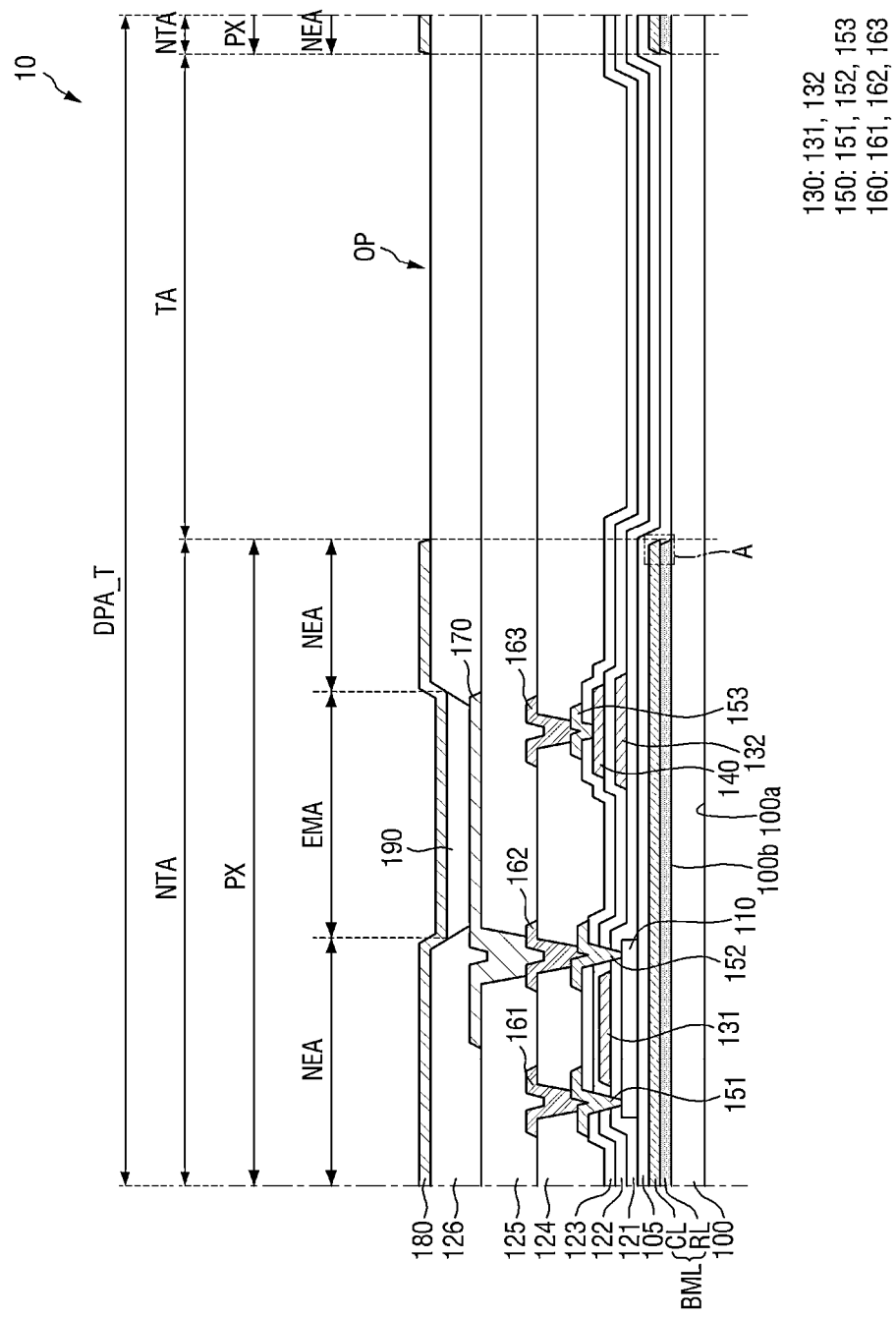
FIG. 5 is a cross-sectional view of a non-transmission area and a transmission area disposed in a display transmission area of the display panel according to an embodiment.

The lower metal pattern BML may include an antireflection layer (refer to RL of FIG. 5). Accordingly, the lower metal pattern BML may suppress or prevent the light reflected by the optical sensor 20 (refer to FIG. 2) from being re-reflected by the display panel 10, thereby suppressing or preventing defects occurring when the re-reflected light is incident to the optical sensor 20 (refer to FIG. 2) again.

Hereinafter, structures of the pixel PX, the transmission area TA, and the non-transmission area NTA of each display area DPA will be described in detail.

Figure 4:
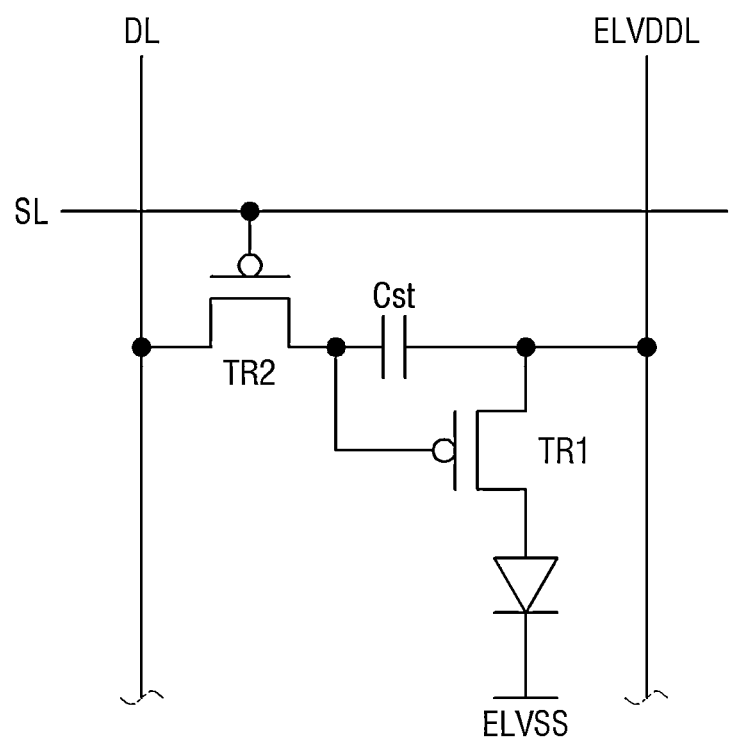
FIG. 4 is a circuit view of one pixel of the display device according to the embodiment.

FIG. 4 is a circuit view of one pixel of the display device according to the embodiment.

Referring to FIG. 4, a pixel circuit may include a first transistor TR1, a second transistor TR2, a capacitor CST, and an organic light emitting diode OLED. A scan line SL, a data line DL, and a first power supply voltage line ELVDDL are connected to each pixel circuit.

The first transistor TR1 may be a driving transistor, and the second transistor TR2 may be a switching transistor. In the drawings, both the first transistors TR1 and the second transistor TR2 are PMOS transistors, but one or all of the first transistor TR1 and the second transistor TR2 may be an NMOS transistor.

A first electrode (source electrode) of the first transistors TR1 is connected to the first power supply voltage line ELVDDL and a second electrode (drain electrode) is connected to an anode electrode of the organic light emitting diode OLED. The first electrode (source electrode) of the second transistor TR2 is connected to a data line DL and the second electrode (drain electrode) is connected to a gate electrode of the first transistors TR1. The capacitor CST is connected between the gate electrode and the first electrode of the first transistors TR1. The cathode electrode of the organic light emitting diode OLED receives a second power voltage ELVSS. The second power voltage ELVSS may be a voltage lower than a first power voltage ELVDD received from the first power supply voltage line ELVDDL.

The second transistor TR2 may output a data signal received from the data line DL in response to a scanning signal applied to a scan line GL. The capacitor CST may charge a voltage corresponding to the data signal received from the second transistor TR2. The first transistor TR1 may control a driving current flowing through the organic light emitting diode OLED corresponding to a charge amount stored in the capacitor CST.

The equivalent circuit of FIG. 4 is only one embodiment, and the pixel circuit may include a larger number of transistors (e.g., seven) and capacitors.

Figure 6:
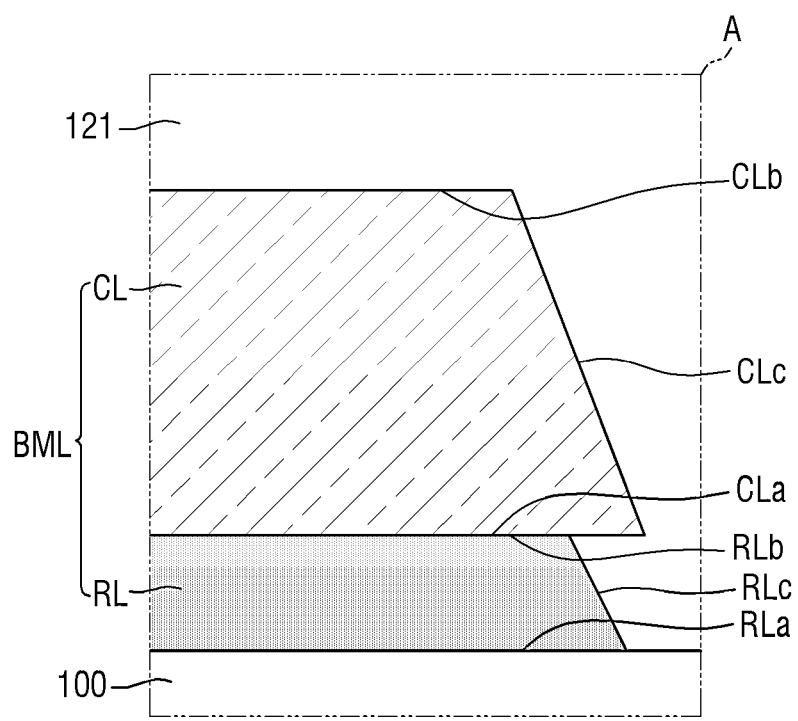
FIG. 6 is an enlarged diagram of enlarging a region A of FIG. 5.

FIG. 5 is a cross-sectional view of the non-transmission area and the transmission area disposed in the display transmission area of the display panel according to the embodiment. FIG. 6 is an enlarged diagram of enlarging a region A of FIG. 5.

First, referring to FIGS. 5 and 6, cross-sectional structures of pixels PX disposed in the non-transmission area NTA and the transmission area TA will be described in more detail.

The display panel 10 may include a light blocking layer, for example, the lower metal pattern BML, the buffer layer 105, the semiconductor layer 110, the first insulating layer 121, the first conductive layer 130, the second insulating layer 122, the second conductive layer 140, the third insulating layer 123, the third conductive layer 150, the fourth insulating layer 124, the fourth conductive layer 160, the fifth insulating layer 125, the fifth conductive layer 170, the pixel defining film 126 including an opening exposing the fifth conductive layer 170, the organic layer 190 disposed on the fifth conductive layer 170 in the opening of the pixel defining film 126, and the sixth conductive layer 180 disposed on the organic layer 190 and the pixel defining film 126. Each of the layers described above may be formed of a single film but may also be formed of a laminated film including a plurality of films. Other layers may be further disposed between the layers described above.

The substrate 100 supports the respective layers disposed thereon. The substrate 100 may be formed of an insulating material such as a polymer resin, or the like. Examples of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonat (PC), cellulose triacetate (CAT), cellulose acetate propionate (CAP), or combinations thereof.

The substrate 100 may be a flexible substrate which may be bent, folded, rolled, and the like. An example of the material constituting the flexible substrate may be polyimide (PI) but the material constituting the substrate is not limited thereto. For example, the substrate 100 may be a rigid substrate, and in this case, the substrate 100 may include at least one selected from glass, quartz, etc.

The substrate 100 may include one surface 100b and the other surface 100a, which is an opposite surface of the one surface 100b. Although not limited thereto, the other surface 100a of the substrate 100 may be a lower surface and the one surface 100b may be an upper surface. In other words, when the display device 1 is a front emission type, the other surface 100a of the substrate 100 faces a rear surface and the one surface 100b of the substrate 100 may face a front surface of the display panel 10 through which an image is displayed. In addition, even if there is no separate mention herein, one surface of each laminated configuration faces the same direction, and the other surface of each laminated configuration faces the same direction which faces the one surface.

The lower metal pattern BML is disposed on the substrate 100. Although not limited thereto, the lower metal pattern BML may be disposed on the one surface 100b of the substrate 100. The lower metal pattern BML may perform a function of preventing light incident onto the display transmission area DPA_T from being reflected. Further, the lower metal pattern BML may perform a function of preventing the light incident from the bottom of the lower metal pattern BML onto the display transmission area DPA_T from being irradiated to the semiconductor layer 110 disposed on the top.

The lower metal pattern BML may include an antireflection layer RL and a conductive metal layer CL. The antireflection layer RL and the conductive metal layer CL may include substantially the same pattern shape as each other in a plan view. The antireflection layer RL may be disposed below the conductive metal layer CL. In other words, the conductive metal layer CL may be disposed on one side of the antireflection layer RL. When the optical sensor 20 (refer to FIG. 2) is further arranged, the antireflection layer RL may be disposed to be closer to the optical sensor 20 (refer to FIG. 2) than the conductive metal layer CL. For example, when the lower metal pattern BML is disposed on one surface 100b of the substrate 100, the antireflection layer RL may be disposed between the substrate 100 and the conductive metal layer CL.

The antireflection layer RL and the conductive metal layer CL may have different electrical conductivities. For example, the conductivity of the antireflection layer RL may be less than the conductivity of the conductive metal layer CL.

The conductive metal layer CL may include a layer that imparts conductivity to the lower metal pattern BML and may include a low resistance material. For example, the conductive metal layer CL may include at least one of metals such as molybdenum (Mo), copper (Cu), aluminum (AL), and titanium (Ti) as a conductive material.

The antireflection layer RL may absorb most of light incident onto the lower metal pattern BML and the conductive metal layer CL reflects a portion of the light incident onto the lower metal layer CL. However, reflected light reflected at different interfaces may offset each other. The antireflection layer RL may further include at least one of indium (In) and zinc (Zn) while including molybdenum (Mo). The antireflection layer RL may further include at least one of indium oxide ($InO_x$) and zinc oxide ($ZnO_x$) while including molybdenum oxide ($MoO_x$). Hereinafter, the antireflection layer RL includes molybdenum (Mo) and indium (In). The description about indium (In) may be applied to zinc (Zn).

In detail, the antireflection layer RL may include at least one indium (IN), indium alloy, indium oxide ($InO_x$) or indium alloy oxide, while including at least one of molybdenum (Mo), molybdenum alloy, molybdenum oxide (MoOx) and molybdenum alloy oxide. For example, the antireflection layer RL may include at least one of indium-molybdenum alloy and indium-molybdenum oxide (In-MoOx) or include indium oxide (InOx) and molybdenum oxide (MoOx).

When the antireflection layer RL includes molybdenum oxide (MoOx) and indium oxide (InOx), in molybdenum oxide (MoOx), a mole ratio of molybdenum (Mo) atoms and oxygen (O) atoms may be within the range of 1:2 to 1:3 or may be within the range of 1:1 to 1:5 but is not limited thereto.

The content of indium oxide (InOx) may be equal to or larger than the content of molybdenum oxide (MoOx). Although not limited thereto, a composition ratio of molybdenum oxide (MoOx) and indium oxide (InOx) may be in the range of 1:1 to 1:4 or in the range of 1:1 to 1:3 or may be 1:3.

The content of indium oxide (InOx) and the content of molybdenum oxide (MoOx), for example, the content of molybdenum oxide (MoOx) may be within the range of 20 at % to 50 at % or in the range of 30 at % to 40 at % or may be 25 at %. The content of indium oxide (InOx) may be in the range of 50 at % or 80 at % or in the range of 60 at % to 75 at % or may be 75 at %.

When the content of indium oxide (InOx) and the content of molybdenum oxide (MoOx) are within the above range, the quantity of light reflected by the lower metal pattern BML may be reduced, and the antireflection layer RL of the lower metal pattern BML can be wet-etched. In other words, when the content of indium oxide (InOx) is equal to or larger than 50 at %, the antireflection layer RL can be wet-etched to prevent defects and the like such that the antireflection layer RL may have a tapered sidewall. Further, when the content of molybdenum oxide (MoOx) is equal to or larger than 20 at %, the quality of light reflected by the lower metal pattern BML may be reduced. The detailed description thereof will be described below.

The composition of molybdenum oxide (MoOx) and the content of indium oxide (InOx) may be measured by X-ray photoelectron spectroscopy (XPS), but the method of measuring the content is not limited thereto. For example, the content may also be measured by energy dispersion x-ray spectrometry (EDS), secondary ion mass spectrometry (SIMS), or the like.

As the antireflection layer RL includes indium (In, or indium oxide (InOx)), the antireflection layer RL can be wet-etched, thereby improving reliability of the display device 1. Specifically, when the antireflection layer RL is dry-etched, a tail of an edge area of the antireflection layer RL is elongated. As the antireflection layer RL includes indium (In, or indium oxide (InOx)), the antireflection layer RL can be wet-etched. Accordingly, the tail of the edge area of the antireflection layer RL is not elongated, thereby improving reliability of the display device 1.

As the antireflection layer RL is patterned by wet-etching, a side surface CLc of the conductive metal layer CL may protrude outward from a side surface RLc of the antireflection layer RL. The antireflection layer RL includes the other surface RLa facing the substrate 100 and one surface RLb which is an opposite surface to the other surface RLa and may include a side surface RLc connecting the other surface RLa and the one surface RLb. Although not limited thereto, the other surface RLa of the antireflection layer RL may be a lower surface, and the one surface RLb may be an upper surface. The conductive metal layer CL may include the other surface CLa facing the one surface RLb of the antireflection layer RL, one surface CLb which is an opposite surface to the other surface CLa facing the conductive metal layer CL, and a side surface CLc connecting the other surface CLa and the one surface CLb of the conductive metal layer CL. Although not limited thereto, the other surface CLa of the conductive metal layer CL may be a lower surface and the one surface CLb may be an upper surface.

In this case, the side surface CLc of the conductive metal layer CL may further protrude outward than the side surface RLc of the antireflection layer RL, but it is not limited thereto. For example, ends of the side surface CLc of the conductive metal layer CL and the side surface RLc of the antireflection layer RL may be aligned with each other. When side surface CLc of the conductive metal layer CL further protrudes outward than the side surface RLc of the antireflection layer RL, the lower metal pattern BML may include an under-cut shape in a cross-sectional view.

The thickness of the antireflection layer RL may be smaller than 200 nm, for example, smaller than 100 nm. For example, the thickness of the antireflection layer RL may be in the range of 1 nm to 200 nm, for example, in the range of 10 nm to 100 nm.

The lower metal pattern BML includes the antireflection layer RL to suppress or prevent defects which may occur in the optical sensor 20 (refer to FIG. 2) of the display device 1. To describe this, FIGS. 7 to 9 are further referred thereto.

Figure 7:
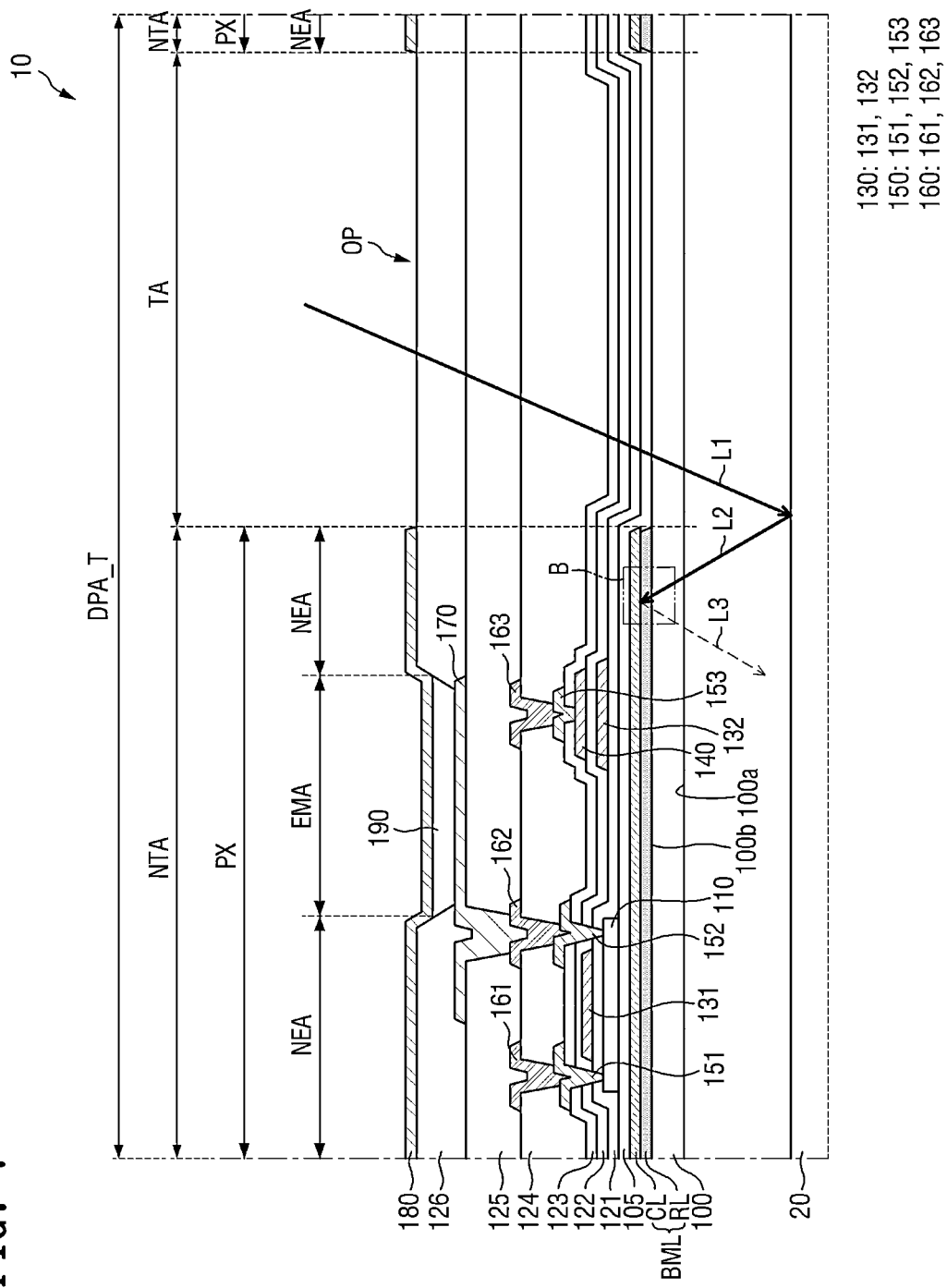
FIG. 7 is a diagram illustrating a progress path of external light incident on the display transmission area of the display device according to the embodiment.

FIG. 7 is a diagram illustrating a progressing path of external light incident on the display transmission area of the display device according to the embodiment. FIG. 8 is an enlarged diagram of enlarging a region B of FIG. 7. In FIG. 7, the optical sensor 20 is illustrated together with the cross-sectional view of the display panel 10.

Figure 8:
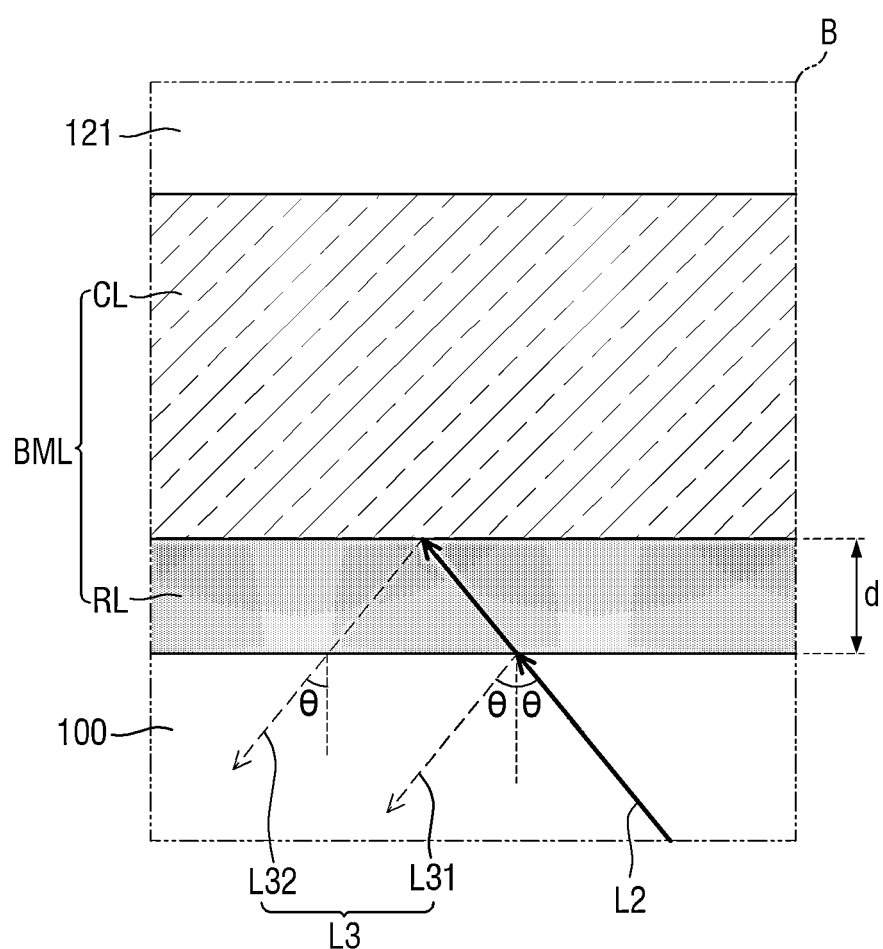
FIG. 8 is an enlarged diagram of enlarging a region B of FIG. 7.
Figure 9:
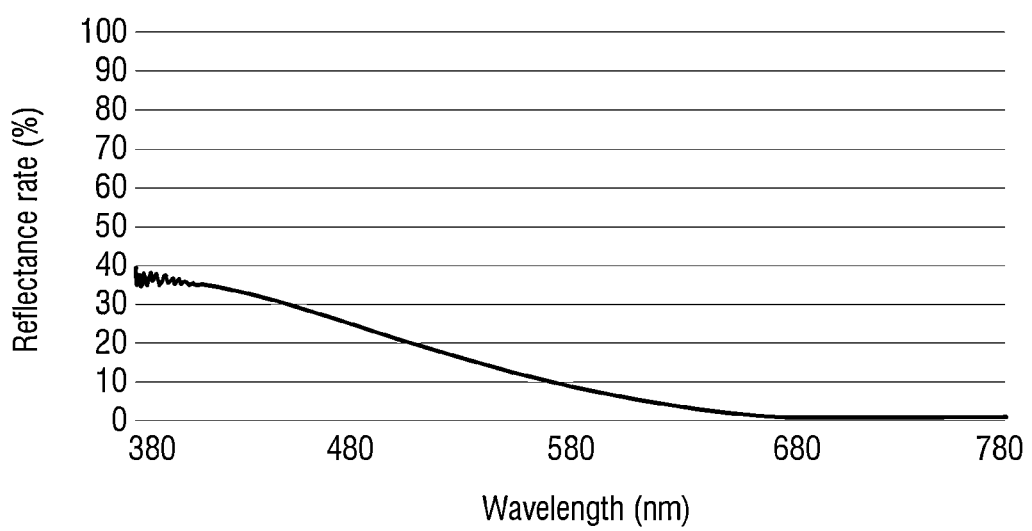
FIG. 9 is a graph showing a reflection rate of a lower metal pattern according to a wavelength.

Referring further to FIGS. 7 to 8, incident light L1 incident on the display transmission area DPA_T may pass through the transmission area TA to reach the optical sensor 20. The incident light L1 incident onto the optical sensor 20 may be reflected by a lens and the like of the optical sensor 20. Reflected light L2 may be incident onto the display panel 10 from the optical sensor 20.

Most of the reflected light L2 incident onto the display panel 10 may be absorbed by the antireflection layer RL of the lower metal pattern BML. Some of the reflected light L2 which is not absorbed by the antireflection layer RL may be re-reflected by the conductive metal layer CL, and re-reflected light L3 may be incident onto the optical sensor 20. However, although some of the reflected light L2 is re-reflected by the conductive metal layer CL, the re-reflected light L3 reflected at n different interfaces may offset each other.

Specifically, the reflected light L2 incident to the antireflection layer RL may be reflected at an interface between the antireflection film RL and the substrate 100. In this case, the re-reflected light L3 may include first re-reflected light L31 and second re-reflected light L32 reflected at an interface other than the interface between the antireflection film RL and the substrate 100, for example, an interface between the antireflection film RL and the conductive metal layer CL. The first re-reflected light L31 and the second re-reflected light L32 which are reflected at different interfaces may have opposite phases to each other and offset from each other. When a thickness d of the antireflection layer RL satisfies the following Equation 1, the first re-reflected light L31 and the second re-reflected light L32 which are reflected at the different interfaces may have opposite phases to each other to offset from each other.

$$d \cdot \cos\theta = 2m \cdot \lambda/4 \qquad \text{[Equation 1]}$$

In Equation 1, $\lambda$ represents a wavelength of external light L, m means an integer, and $\theta$ refers to an incident angle or reflection angle.

As the antireflection layer RL is disposed, the reflected light L2 reflected by the optical sensor 20 is absorbed before entering into the display panel 10 and may be suppressed or prevented from being reflected at interfaces in the display panel 10. Further, the re-reflected light L3 that includes the first re-reflected light L31 and the second re-reflected light L32 may offset from each other.

When the reflected light L2 reflected by the optical sensor 20 re-enters into the optical sensor 20, a phenomenon such as ghosts or flares may occur in the optical sensor 20. When the optical sensor 20 includes a configuration such as a camera capable of photographing an image, the quality of photographs or images may be lowered by the phenomenon of ghosts or flares.

Accordingly, it is possible to suppress or prevent the reflected light L2 reflected by the optical sensor 20 from re-entering into the optical sensor 20 and to suppress or prevent defects or the like caused by the phenomenon such as ghosts or flares described above. Furthermore, it is possible to improve the reliability of the display device 1.

FIG. 9 is a graph showing a reflection rate of the lower metal pattern according to a wavelength. An X-axis direction of the graph of FIG. 9 represents a wavelength (nm), and a Y axis represents a reflection rate (%).

Referring further to FIG. 9, the graph of FIG. 9 shows a reflection rate according to a wavelength of the reflected light in the lower metal pattern BML. The graph of FIG. 9 shows a graph when the conductive metal layer CL of the lower metal pattern BML includes molybdenum (Mo) and the thickness thereof is 250 nm, and the antireflective layer RL includes molybdenum oxide (MoOx) and indium oxide (InOx) and the thickness thereof is 60 nm.

In the graph of FIG. 9, when the wavelength is 450 nm, the reflection rate of the lower metal pattern BML is 27.2%, and when the wavelength is 550 nm, the reflection rate of the lower metal pattern BML is 9.9%, and when the wavelength is 650 nm, the reflection rate of the lower metal pattern BML is 1.1%.

Referring back to FIG. 5, a buffer layer 105 is disposed on the lower metal pattern BML. The buffer layer 105 may prevent diffusion of impurity ions, prevent penetration of moisture or external air, and perform a surface planarization function. The buffer layer 105 may include silicon nitride, silicon oxide, or silicon oxynitride. The buffer layer 105 may be omitted according to a type or a process condition of the substrate 100.

The semiconductor layer 110 is disposed on the buffer layer 105. The semiconductor layer 110 forms a channel of a thin film transistor of the pixel PX. The semiconductor layer 110 may include polycrystalline silicon. However, it is not limited thereto, and the semiconductor layer 110 may include monocrystalline silicon, low-temperature polycrystalline silicon, amorphous silicon, or an oxide semiconductor. The oxide semiconductor may include, for example, a binary compound (ABx), a ternary compound (ABxCy), and a quartz-based compound (ABxCyDz) containing indium, zinc, gallium, tin, titanium, aluminum, hafnium (Hf), zirconium (Zr), magnesium (Mg), and the like.

The first insulating layer 121 may be a gate insulating film having a gate insulating function. The first insulating layer 121 may include a silicon compound, a metal oxide, and the like. For example, the first insulating layer 121 may include silicon oxide, silicon nitride, silicon oxynitride, aluminum oxide, tantalum oxide, hafnium oxide, zirconium oxide, titanium oxide, and the like. The oxides may be used alone or in combination with each other. The first insulating layer 121 may be a single film or a multilayer film formed of a laminated film made of different materials.

The first insulating layer 121 may be disposed on the semiconductor layer 110 and may be generally disposed over the entire surface of the substrate 100.

The first conductive layer 130 is disposed on the first insulating layer 121. The first conductive layer 130 may be a first gate conductive layer. The first conductive layer 130 may include a gate electrode 131 of a thin film transistor and a scan line connected thereto, and a storage capacitor first electrode 132 of a pixel PX.

The first conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The first conductive layer 130 may be a single film or a multilayer film.

A second insulating layer 122 may be disposed on the first conductive layer 130. The second insulating layer 122 may be an interlayer insulating layer. The second insulating layer 122 may include an inorganic insulation material, such as silicon oxide, silicon nitride, silicon oxynitride, hafnium oxide, aluminum oxide, titanium oxide, tantalum oxide, zinc oxide, and the like.

The second conductive layer 140 is disposed on the second insulating layer 122. The second conductive layer 140 may be a second gate conductive layer. The second conductive layer 140 may include a storage capacitor second electrode 140. The second conductive layer 140 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The second conductive layer 140 may be made of the same material as the first conductive layer 130 but is not limited thereto. The second conductive layer 140 may be a single film or a multilayer film.

A third insulating layer 123 is disposed on the second conductive layer 140. The third insulating layer 123 may be an interlayer insulating layer. The third insulating layer 123 may include an inorganic insulating material, such as silicon oxide, silicon nitride, silicon oxynitride, hafnium oxide, aluminum oxide, titanium oxide, tantalum oxide, zinc oxide, and the like, or an organic insulating material, such as polyacrylates resin, epoxy resin, phenolic resin, polyamides resin, polyimides resin, unsaturated polyesters resin, polyphenylenethers resin, polyphenylenesulfides resin, or benzocyclobutene (BCB). The third insulating layer 123 may be a single film or a multilayer film formed of a laminated film made of different materials.

A third conductive layer 150 is disposed on the third insulating layer 123. The third conductive layer 150 may be a first source/drain conductive layer. The third conductive layer 150 may include a first electrode 151 and a second electrode 152 of a thin film transistor of a pixel PX. The first electrode 151 and the second electrode 152 of the thin film transistor may be electrically connected to a source area and a drain area of the semiconductor layer 110 through a contact hole formed through the third insulating layer 123, the second insulating layer 122, and the first insulating layer 121. A first power voltage electrode 153 of the pixel PX may be formed of the third conductive layer 150.

The third conductive layer 150 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The third conductive layer 150 may be a single film or a multilayer film. For example, the third conductive layer 150 may have a lamination structure such as Ti/Al/Ti, Mo/Al/Mo, Mo/AlGe/Mo, Ti/Cu, or the like.

A fourth insulating layer 124 is disposed on the third conductive layer 150. The fourth insulating layer 124 covers the third conductive layer 150. The fourth insulating layer 124 may be an intermetal dielectric layer. The fourth insulating layer 124 may include an organic insulating material, such as polyacrylates resin, epoxy resin, phenolic resin, polyamides resin, polyimides resin, unsaturated polyesters resin, polyphenylenethers resin, polyphenylenesulfides resin, or benzocyclobutene (BCB). When the fourth insulating layer 124 includes the organic insulating material, the upper part may be generally flattened despite a step of the lower part.

A fourth conductive layer 160 is disposed on the fourth insulating layer 124. The fourth conductive layer 160 may be a second source/drain conductive layer. The fourth conductive layer 160 may include a data line, a connection electrode 162, and first power voltage lines 161 and 163 of a pixel PX. The first power voltage line 161 may be electrically connected to the first electrode 151 of the thin film transistor of the pixel PX through a contact hole formed through the fourth insulating layer 124 in the pixel PX. The connection electrode 162 may be electrically connected to the second electrode 152 of the thin film transistor of the pixel PX through the contact hole formed through the fourth insulating layer 124. The first power voltage line 163 may also be electrically connected to the first power voltage electrode 153 through the contact hole formed through the fourth insulating layer 124.

The fourth conductive layer 160 may include at least one metal selected from aluminum (Al), molybdenum (Mo), platinum (Pt), palladium (Pd), silver (Ag), magnesium (Mg), gold (Au), nickel (Ni), neodymium (Nd), iridium (Ir), chrome (Cr), calcium (Ca), titanium (Ti), tantalum (Ta), tungsten (W), and copper (Cu). The fourth conductive layer 160 may be a single film or a multilayer film. The fourth conductive layer 160 may be made of the same material as the third conductive layer 150 but is not limited thereto.

A fifth insulating layer 125 is disposed on the fourth conductive layer 160. The fifth insulating layer 125 covers the fourth conductive layer 160. The fifth insulating layer 125 may be an inter metal dielectric layer. The fifth insulating layer 125 may include the same material as the fourth insulating layer 124 described above or include at least one material selected from materials exemplified as the constituent material of the fourth insulating layer 124.

A fifth conductive layer 170 is disposed on the fifth insulating layer 125. An anode electrode, which is a pixel electrode, may be formed of the fifth conductive layer 170. The anode electrode may be electrically connected to the connection electrode 162 formed of the fourth conductive layer 160 through the contact hole formed through the fifth insulating layer 125 to be connected to the second electrode 152 of the thin film transistor. The anode electrode may be at least partially overlapped with the emission area EMA of the pixel PX.

The fifth conductive layer 170 is not limited thereto but may have a laminated film structure laminated with a high-work function material layer such as indium-tin-oxide (ITO), indium-zinc-oxide (IZO), zinc oxide (ZnO), and indium oxide (In$_2$O$_3$) and a reflective material layer such as silver (Ag), magnesium (Mg), aluminum (Al), platinum (PT), lead (PD), gold (Au), nickel (Ni), neodymium (Nd), iridium (Ir), chrome (Cr), lithium (Li), calcium (Ca) or mixtures thereof. The high-work function material layer may be disposed above the reflective material layer and disposed close to an organic layer 190. The fifth conductive layer 170 may have a multilayer structure of ITO/Mg, ITO/MgF, ITO/Ag, and ITO/Ag/ITO, but the present inventive concept is not limited thereto.

A pixel defining film 126 may be disposed on the fifth conductive layer 170. The pixel defining film 126 may be at least partially overlapped with the non-emission area NEA of the pixel PX. The pixel defining film 126 may include an opening exposing the fifth conductive layer 170. The pixel defining film 126 may include an inorganic insulating material such as silicon oxide, silicon nitride, silicon oxynitride, hafnium oxide, aluminum oxide, titanium oxide, tantalum oxide, zinc oxide, and the like, or an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB). The pixel defining film 126 may be a single film or a multilayer film formed of a laminated film made of different materials.

The organic layer 190 is disposed in the opening of the pixel defining film 126. The organic layer 190 may include an organic light emitting layer, a hole injection/transport layer, and an electron injection/transport layer. The organic layer 190 may be overlapped with the emission area EMA.

A sixth conductive layer 180 is disposed on the organic layer 190 and the pixel defining film 126. A cathode electrode which is a common electrode may be formed by the sixth conductive layer 180. The cathode electrode may be disposed in the non-emission area NEA as well as the emission area EMA. That is, the cathode electrode may be disposed on the front surface of each pixel PX. The sixth conductive layer 180 may include a low-work function material layer, such as Li, Ca, LiF/Ca, LiF/Al, Al, Mg, Ag, Pt, Pd, Ni, Au Nd, Ir, Cr, BaF, Ba or compounds or mixtures (e.g., a mixture of Ag and Mg) thereof. The sixth conductive layer 180 may further include a transparent metal oxide layer disposed on the low-work function material layer.

Although not illustrated in the drawing, an encapsulation film may be disposed on the top of the sixth conductive layer 180. The encapsulation film may include an inorganic film and an organic film. In an embodiment, the encapsulation film may include a first inorganic film, an organic film disposed on the first inorganic film, and a second inorganic film disposed on the organic film.

Subsequently, a cross-sectional structure of the transmission area TA will be described. The transmission area TA has a structure in which some layers are removed from the laminated structure of the non-transmission area NTA. Since the transmission area TA is the area where the light is not emitted, layers corresponding to the anode electrode, the organic light emitting layer, the cathode electrode, and the like are able to be omitted. Due the omission of the layers, the transmission area TA may have a higher transmission rate than that of the non-transmission area NTA.

Specifically, in the transmission area TA, the sixth conductive layer 180 as the cathode electrode is not disposed. The cathode electrode is disposed over the entire area of the sixth conductive layer 180 in the pixel PX as the common electrode but removed from the transmission area TA to include a transmission opening OP. The transmission opening OP may be formed in the sixth conductive layer 180. In a front emission type panel, the cathode electrode may transmit most light, but a portion of light may be reflected or absorbed. By removing the first conductive layer 180 which is the cathode electrode in the transmission portion TA, a higher transmission rate of the transmission portion TA than that of the non-transmission area NTA may be secured.

In addition, in the transmission area TA, the fifth conductive layer 170 as the anode electrode may not be disposed. In the front emission type panel, the anode electrode includes the reflective material layer as described above. The fifth conductive layer 170 may be removed in the transmission area TA so that the light transmission may be improved in the transmission area TA. In addition, in the transmission area TA, the organic layer 190 is removed to maintain a higher transmission rate. Furthermore, in the transmission area TA, a semiconductor layer or other conductive layers may be removed.

Therefore, the laminated structure of the transmission area TA, as illustrated in FIG. 5, may be the substrate 100, the buffer layer 105, the first insulating layer 121, the second insulating layer 122, the third insulating layer 123, the fourth insulating layer 124, the fifth insulating layer 125, and the pixel defining film 126.

The laminated structure of the transmission area TA is not limited thereto, and the insulating films may be further removed. For example, in the transmission area TA, all of the pixel defining film 126, the fifth insulating layer 125, the fourth insulating layer 124, the third insulating layer 123, the second insulating layer 122, the first insulating layer 121, and the buffer layer 105 may be removed to expose the surface of the substrate 100.

Figure 10:
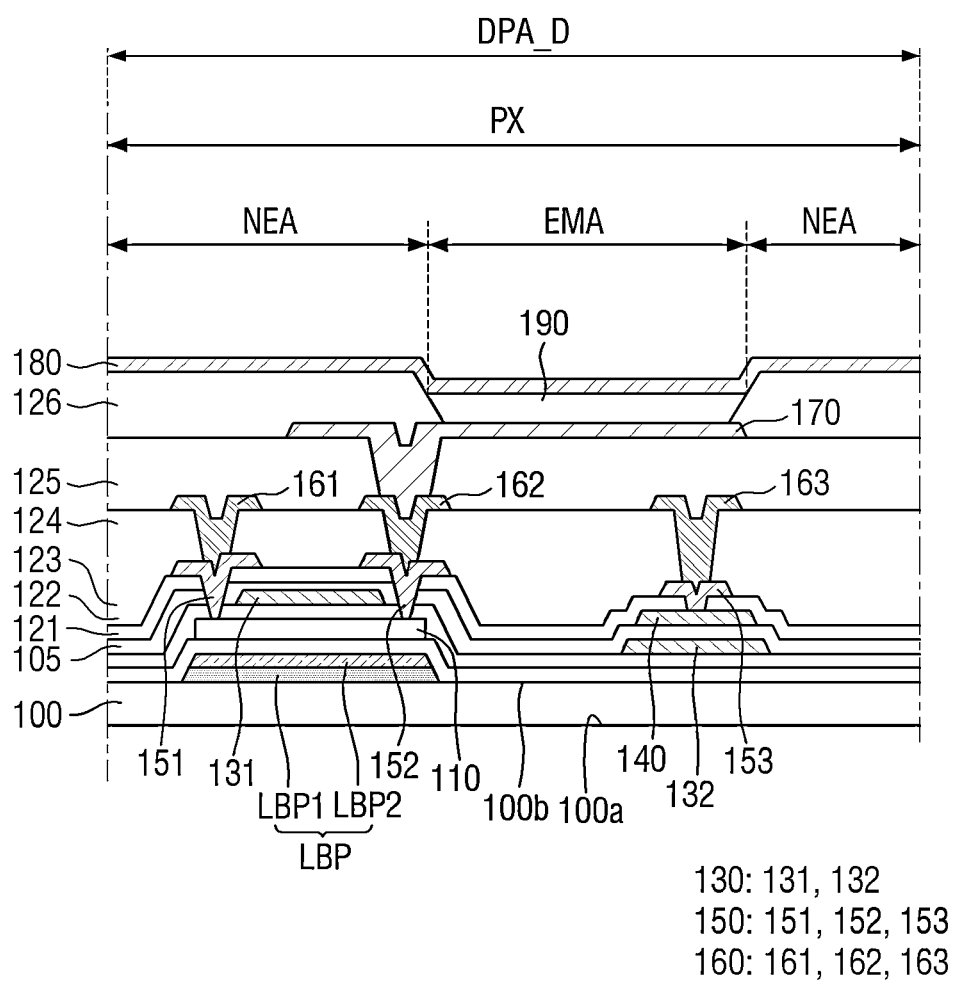
FIG. 10 is a cross-sectional view of a display dedicated area of the display panel according to the embodiment.

FIG. 10 is a cross-sectional view of the display dedicated area of the display panel according to the embodiment. FIG. 10 illustrates a cross-sectional view of a pixel PX disposed in the display dedicated area DPA_D and the same reference numeral is designated to substantially the same structure as the pixel PX disposed in the display transmission area DPA_T of FIG. 5.

Referring to FIG. 10, the pixel PX disposed in the display dedicated area DPA_D may include substantially the same laminated structure with the pixel PX disposed in the display transmission area DPA_T. The detailed description thereof has been described and thus omitted.

The pixel PX disposed in the display dedicated area DPA_D may include a lower light blocking pattern LBP other than the lower metal pattern BML (refer to FIG. 5). The lower light blocking pattern LBP may be disposed on the same layer as the lower metal pattern BML (refer to FIG. 5). When the lower metal pattern BML (refer to FIG. 5) is disposed on the substrate 100, the lower light blocking pattern LBP may be disposed on the substrate 100.

The lower light blocking pattern LBP is not disposed over the entire area of the display dedicated area DPA_D but may be patterned to cover a part of the display dedicated area DPA_D. The lower light blocking pattern LBP may be overlapped with at least a part of the semiconductor layer 110 below the semiconductor layer 110. The lower light blocking pattern LBP may overlap with the semiconductor layer 110 to completely cover a lower surface of the semiconductor layer 110. The lower light blocking pattern LBP may at least overlap with a channel area of the semiconductor layer 110. Accordingly, it is possible to suppress or prevent the light from being incident to the channel area of the semiconductor layer 110.

The lower light blocking pattern LBP may include a first pattern layer LBP1 and a second pattern layer LBP2 which are laminated sequentially. The first pattern layer LBP1 may include substantially the same material as an antireflective layer RL (refer to FIG. 5) of the lower metal pattern BML (refer to FIG. 5) and the second pattern layer LBP2 may include substantially the same material as a conductive metal layer CL (refer to FIG. 5) of the lower metal pattern BML (refer to FIG. 5).

The present inventive concept is not limited thereto, but the lower light blocking pattern LBP may be formed by the same process as the lower metal pattern BML (refer to FIG. 5).

Hereinafter, another embodiment will be described. In the following embodiment, duplicated description of the same configurations as those described above will be omitted or simplified, and differences will be mainly described.

Figure 11:
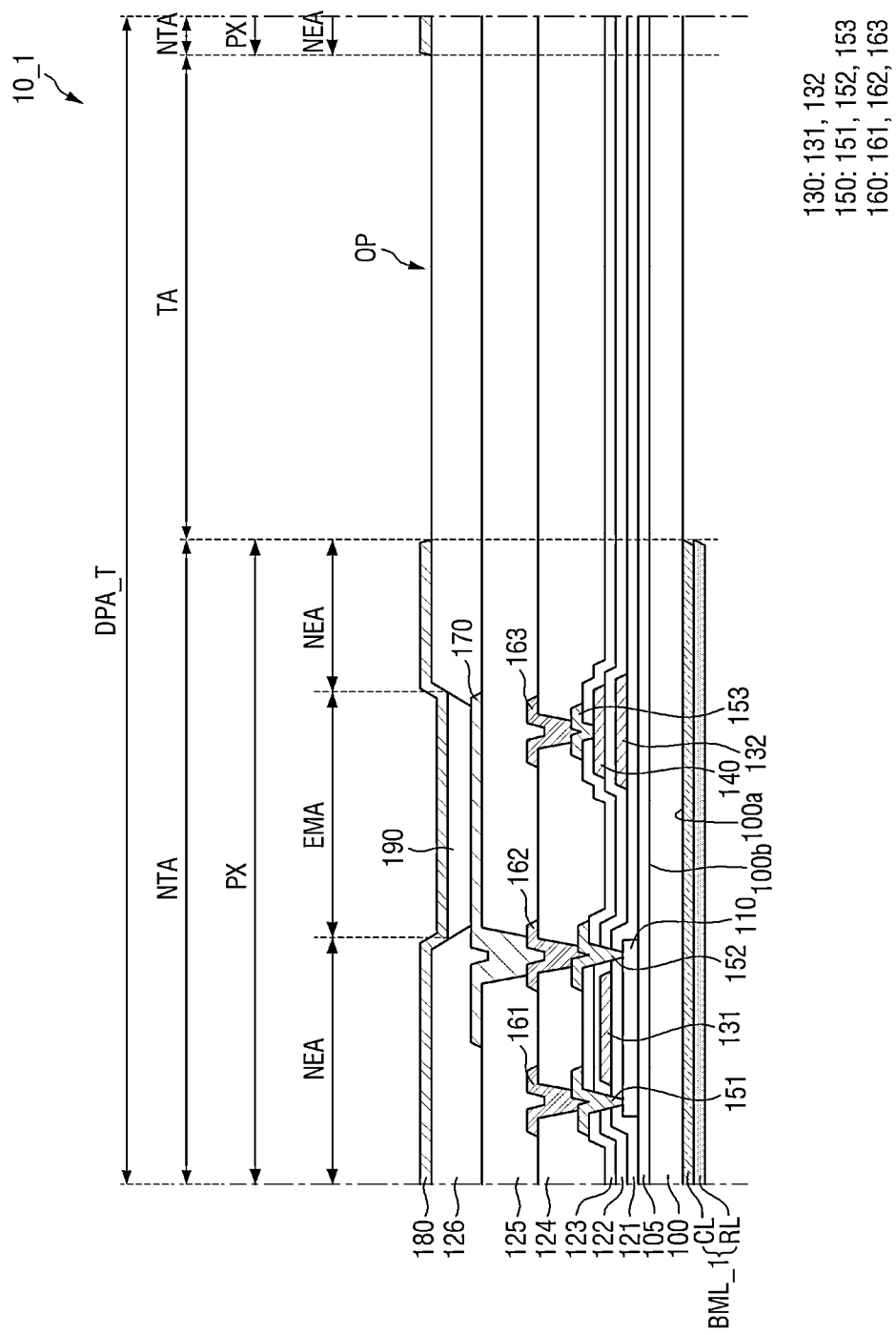
FIG. 11 is a cross-sectional view of a display transmission area of a display panel according to another embodiment.

FIG. 11 is a cross-sectional view of a display transmission area of a display panel according to another embodiment.

Referring to FIG. 11, a lower metal pattern BML_1 disposed in a display transmission area DPA_T of a display panel 10_1 according to the embodiment is disposed on the other surface 100a of a substrate 100. In other words, the substrate 100 may be located between the lower metal pattern BML_1 and a semiconductor layer 110. The display panel 10_1 in FIG. 11 may be similar to the display panel 10 in FIG. 7 except that the lower metal pattern BML_1 is formed on the other surface 100a of the substrate 100. The lower metal pattern BML_1 may be formed before forming constituent elements of the pixel other than the lower metal pattern BML_1 or after forming the constituent elements of the pixel lower metal pattern BML_1.

Even in the case, it is possible to suppress or prevent external light introduced to the display transmission area DPA_T from being re-reflected and improve reliability of the display device 1. Further, the lower metal pattern BML_1 is disposed on the other surface 100a of the substrate 100 to smoothly block reflective light introduced to the display panel 10, thereby further improving the reliability of the display panel 10_1.

Figure 12:
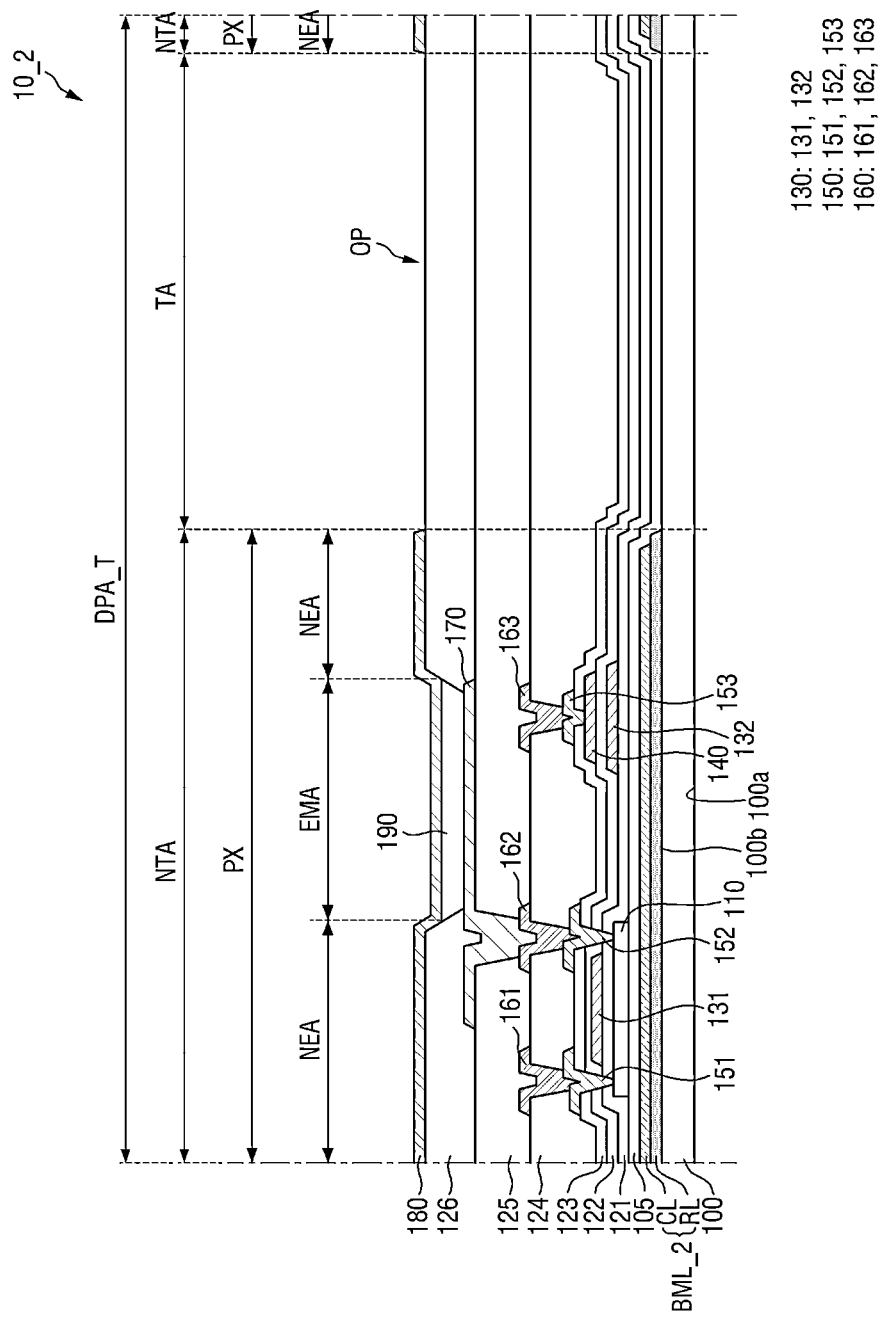
FIG. 12 is a cross-sectional view of a display transmission area of a display panel according to yet another embodiment.

FIG. 12 is a cross-sectional view of a display transmission area of a display panel according to yet another embodiment.

Referring to FIG. 12, a side surface of an antireflective layer RL of a lower metal pattern BML_2 disposed in a display transmission area DPA_T of a display panel 10_2 according to the embodiment protrudes outside a side surface of a conductive metal layer CL. In a process of etching the lower metal pattern BML_2, the conductive metal layer CL may be etched earlier than the antireflective layer RL, and thus, the side surface of the antireflective layer RL may protrude outside the side surface of the conductive metal layer CL. In this case, an entire area of the conductive metal layer CL may overlap with the antireflective layer RL.

Even in the case, it is possible to suppress or prevent external light introduced to the display transmission area DPA_T from being re-reflected and further, improve reliability of the display device 1. Furthermore, the side surface of the antireflective layer RL protrudes outside the side surface of the conductive metal layer CL to prevent the light more smoothly from being re-reflected on the conductive metal layer CL, thereby more smoothly suppressing or preventing the light from being re-reflected on the lower metal pattern BML_2.

In concluding the detailed description, those skilled in the art will appreciate that many variations and modifications can be made to the preferred embodiments without substantially departing from the principles of the present disclosure. Therefore, the disclosed preferred embodiments of the inventive concept are used in a generic and descriptive sense only and not for purposes of limitation.

What is claimed is:

1. A display device, comprising:
a substrate;
a buffer layer disposed on one surface of the substrate;
a semiconductor layer disposed on the buffer layer;
a gate insulating film disposed on the semiconductor layer;
a gate electrode disposed on the gate insulating film; and
a lower metal pattern disposed on the other surface of the substrate,
wherein the lower metal pattern includes a conductive metal layer disposed on the other surface of the substrate and an antireflection layer disposed on the other surface of the conductive metal layer, and
wherein the antireflection layer includes molybdenum oxide ($M_oO_x$) and at least one of zinc oxide ($Z_nO_x$) and indium oxide ($I_nO_x$).

2. The display device of claim 1, further comprising:
a display area including a first display area and a second display area,
wherein a transmission rate of the first display area is less than that of the second display area and the lower metal pattern is disposed in the second display area.

3. The display device of claim 2, wherein the second display area includes a transmission area and a non-transmission area having different transmission rates, and the lower metal pattern, the semiconductor layer, and the gate electrode are disposed in the non-transmission area and not disposed in the transmission area.

4. The display device of claim 1, wherein the content of the molybdenum oxide of the antireflection layer is within the range of 20 at % to 50 at % and at least one of the zinc oxide ($Z_nO_x$) and indium oxide ($I_nO_x$) is within the range of 50 at % to 80 at %.

5. The display device of claim 1, wherein the conductive metal layer has a higher conductivity than the antireflection layer.

6. The display device of claim 1, wherein the conductive metal layer and the antireflection layer have the same pattern shape in a plan view.

* * * * *